United States Patent [19]

Hidese

[11] Patent Number: 5,033,185
[45] Date of Patent: Jul. 23, 1991

[54] ELECTRONIC COMPONENT MOUNTING APPARATUS

[75] Inventor: Wataru Hidese, Chikushino, Japan

[73] Assignee: Matsushita Electric Industrial Co., Ltd., Kadoma, Japan

[21] Appl. No.: 336,903

[22] Filed: Apr. 12, 1989

[30] Foreign Application Priority Data

Apr. 12, 1988 [JP] Japan .................................. 63-89808

[51] Int. Cl.$^5$ .............................................. H05K 3/30
[52] U.S. Cl. ....................................... 29/740; 29/714; 29/743
[58] Field of Search .................. 29/740, 741, 743, 759, 29/714

[56] References Cited

U.S. PATENT DOCUMENTS

4,646,432  3/1987  Vancelette ............................ 29/743
4,694,570  9/1987  Rudolph et al. ...................... 29/740

Primary Examiner—Carl E. Hall

[57] ABSTRACT

By providing an electronic component mounting apparatus which an adjusting mechanism for adjusting the amount of drive in a path of transmission of drive from a drive unit, which is used for driving each component mounting head between elevated and lowered positions, to each component mounting head, the limit of position to which each component mounting head can be lowered is made adjustable. The provision of a control unit is also made to control the lowered position of each component mounting head according to the height of each of the electronic components to be mounted by the apparatus. The control unit is also operable to determine the lowered position of each component mounting head for the mounting of subsequent electronic components with the height of a first mounted one of the electronic components taken as a reference value so that a correction value can be added to the reference value when the succeeding electronic components are to be mounted.

13 Claims, 5 Drawing Sheets

ELECTRONIC COMPONENT MOUNTING APPARATUS

BACKGROUND OF THE INVENTION

1. Field of the Invention
2. Description of the Prior Art

The present invention relates generally to an electronic component mounting apparatus and, more particularly, to the apparatus for automatically mounting on printed circuit boards electronic components such as, for example, transistors, capacitors and/or resistors.

Hitherto, the electronic component mounting apparatus is well known which comprises a carrier turntable having a plurality of suction heads mounted thereon in radial orientation for holding electronic components by the action of a substantial vacuum developed inside the suction heads so that, during the rotation of the carrier turntable, the electronic components sucked by the respective suction heads can be successively mounted at high speed on a printed circuit board. An example of this prior art component mounting apparatus is illustrated in FIG. 8 in partial top plan view.

Figure 8:
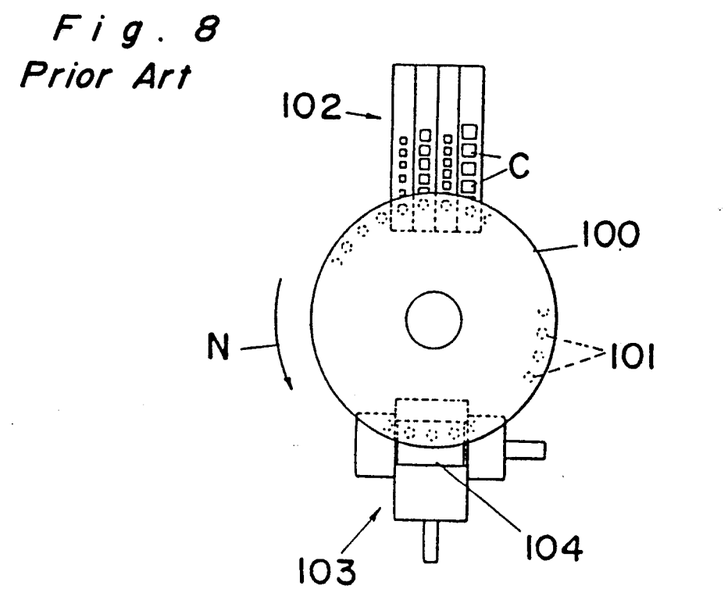
FIG. 8 is a top plan view of the carrier turntable used in the prior art component mounting apparatus.

Referring to FIG. 8, the carrier turntable is generally identified by 100 and has its undersurface carrying a circular row of mounting heads 101 for movement up and down, which row is coaxial with the axis of rotation of the carrier turntable 100. A component delivery unit 102 such as, for example, a tray or a carrier tape, and a movable bench 103 such as, for example, an X-Y table, are disposed beneath the carrier turntable 100.

The illustrated prior art mounting apparatus is so designed that, after any one of the mounting heads 101 having been lowered has picked up the electronic component C from the delivery unit 102, the carrier turntable 100 can be intermittently rotated in a direction shown by N to bring the electronic component C to a position immediately above the movable bench 103 and is then lowered to mount the electronic component C onto a printed circuit board 104 supported on the movable bench 103.

Figure 9:
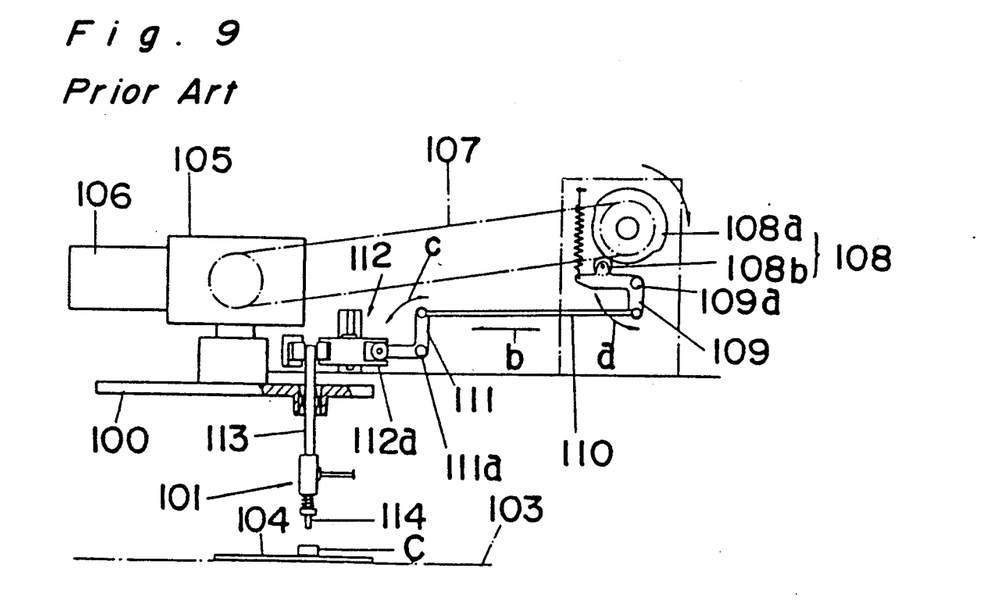
FIG. 9 is a schematic front elevational view of the drive mechanism used in the prior art component mounting apparatus.

A drive mechanism used in the illustrated prior art mounting apparatus for driving the mounting heads 101 is shown in FIG. 9. As shown in FIG. 9, the drive mechanism comprises a drive box 105 and a drive motor 106 for driving the carrier turntable 100 in the direction N intermittently, an endless toothed belt 107, a first motion translator 108 comprised of a cam member 108a and a cam follower 108b, a first motion transmitting lever 109 having one end carrying the cam follower 108b, a tie rod 110 connected at one end with the other end of the motion transmitting lever 109, a second motion transmitting lever 111 operatively connected at one end with the other end of the tie rod 110, a second motion translator 112 comprised of a slider 112a drivingly coupled with the other end of the second motion transmitting lever 111, a head carrier shaft 113 for each mounting head 101, and a nozzle 114 protruding downwardly from the respective mounting head 101 carried by the associated carrier shaft 113.

The prior art component mounting apparatus of the construction shown in and described with reference to FIGS. 8 and 9 operates in the following manner.

Assuming that the drive motor 106 is driven to rotate the cam member 108a through the motion transmitting belt 107, the cam follower 108b moves up and down in contact with the peripheral cam face of the cam member 108a, causing the first motion transmitting lever 109 to be reciprocated about a pivot pin 109a in opposite directions shown by the arrow a. The pivotal motion of the first motion transmitting lever 109 is transmitted to the second motion transmitting lever 111 through the tie rod 110 then reciprocatingly moving horizontally in opposite directions shown by the arrow b, causing the slider 112a to move up and down with the second motion transmitting lever 111 reciprocatingly pivoted about a pivot pin 111a in opposite directions shown by the arrow c. Consequent upon the up and down movement of the slider 112a, the head carrier shaft 113 is reciprocated in a vertical direction perpendicular to the plane of rotation of the carrier turntable 100. In particular, when the shaft 113 is lowered with the associated mounting head 101 approaching the printed circuit board 104, the electronic component C carried by such mounting head can be mounted onto the printed circuit board 104.

The up and down movement of the carrier shaft 113 takes place even when the electronic component C is to be picked up from the delivery unit 102.

The stroke of movement of any one of the mounting heads 101 employed in the prior art component mounting apparatus is fixed as determined by the configuration of the cam member 108a and the cam member 108a is therefore so designed as to realize a desired stroke of movement of any one of the mounting heads 101. This stroke is generally chosen in consideration of the average thickness of the electronic components handled by the mounting apparatus.

Accordingly, where the stroke of movement of any one of the mounting heads is desired to be changed, the prior art component mounting apparatus requires the cam member to be replaced by another cam member of different configuration required to achieve the desired stroke. Accordingly, not only is the manufacture of the plural cam members of different configuration time-consuming, but the prior art component mounting apparatus has a problem in that the replacement of one particular cam member with another one is not easy to accomplish and the machine has to be held inoperative during the replacement.

Figure 10:
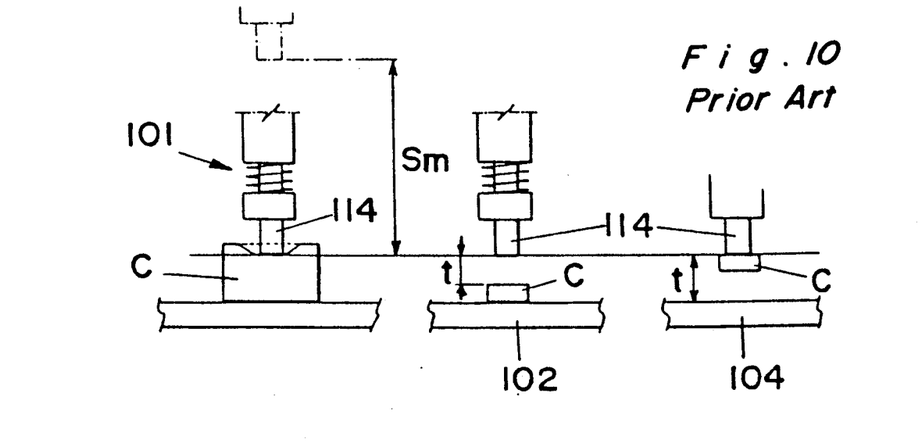
FIG. 10 is a schematic front elevational view of a portion of the drive mechanism used in the prior art component mounting apparatus.

In addition, since the prior art component mounting apparatus of the type referred to above is such that the stroke of movement of the mounting heads is fixed, the apparatus cannot accommodate the electronic components of different thickness. Therefore, where the electronic component desired to be mounted on the printed circuit board has a thickness greater than the average thickness for which the stroke of movement of the mounting heads has been determined, the stroke Sm will be too excessive for such electronic component as shown in FIG. 10(a) and, accordingly, when any one of the mounting head 101 is lowered, the associated nozzle 114 will press deep the electronic component C during the mounting of the latter onto the printed circuit board 104 on the movable bench 102, causing such electronic component C to be eventually impaired or damaged. A similar problem may occur when the mounting head is lowered at the delivery station in readiness for the picking up the electronic component carried by the delivery unit 103.

Conversely, where the electronic component desired to be mounted on the printed circuit board has a thickness smaller than the average thickness for which the stroke of movement of the mounting heads has been determined, the stroke Sm will be too short for such electronic component as shown in FIG. 10(b) and, accordingly, when any one of the mounting head 101 is lowered, the associated nozzle 114 will be spaced a substantial distance t, shown in FIG. 10(b), from the electronic component part C desired to be mounted thereby failing to pick it up at the delivery station from the delivery unit. Also, even when the respective mounting head 101 is lowered at the mounting station above the movable bench 103, a gap corresponding to the distance t will be formed between the component part C, sucked by the mounting head 114, and the printed circuit board 104 as shown in FIG. 10(c) and the electronic component C may be released from the mounting head 114 while afloat above the printed circuit board 104. Once this occur, the electronic component C may be dropped by the effect of a gravitational force onto the printed circuit board 104, failing to assume a proper position relative to the printed circuit board 104.

As can readily be understood from the above discussion on the prior art component mounting apparatus, it is a very important underlying problem to provide that the stroke of movement of the mounting heads can be adjusted easily and properly so that the component mounting apparatus can accommodate electronic components of different sizes.

There is well known a means for adjusting the stroke of movement of the mounting heads, which means comprises a means for supporting the movable bench for movement close to and away from the mounting heads. This prior art adjusting means, however, has a problem in that it cannot precisely accommodate a change in thickness of the electronic components desired to be mounted and is, therefore, so designed as to permit the movable bench to assume one of elevated and lowered positions. Accordingly, when an electronic component having a thickness generally intermediate of the stroke of movement of the movable bench is to be mounted, misalignment and/or misplacement of such electronic component tend to occur often.

In addition, considering that the delivery unit is generally installed on a table fixed above the floor, the use of the upwardly and downwardly shiftable bench in combination with the fixed delivery unit is not possible and, therefore, the adjusting means referred to above cannot work satisfactorily at the delivery station.

It may, however, be contemplated that an adjusting means similar to the adjusting means for supporting the movable bench for movement up and down may be employed in the delivery unit for supporting the latter for movement up and down in unison with the movement of the bench. In such case, since the two adjusting means are required one for each of the bench and the delivery unit, the apparatus as a whole will become bulky and expensive to make besides the use of complicated elevating means as well as control means.

SUMMARY OF THE INVENTION

Accordingly, it is an essential object of the present invention to provide an improved component mounting apparatus wherein a simple and inexpensive means is provided for adjusting the stroke of movement of any one of the mounting heads at any one of the delivery and mounting stations.

Another object of the present invention is to provide an improved component mounting apparatus of the type referred to above, which can accommodate electronic components of varying thickness, that is, capable of picking up and mounting any one of the electronic components of varying thicknesses, without causing any bowing of boards for mounting the components thereon.

BRIEF DESCRIPTION OF THE DRAWINGS

These and other objects and features of the present invention will become clear from the following description taken in conjunction with preferred embodiments thereof with reference to the accompanying drawings, in which.

DETAILED DESCRIPTION OF THE INVENTION

Figure 1:
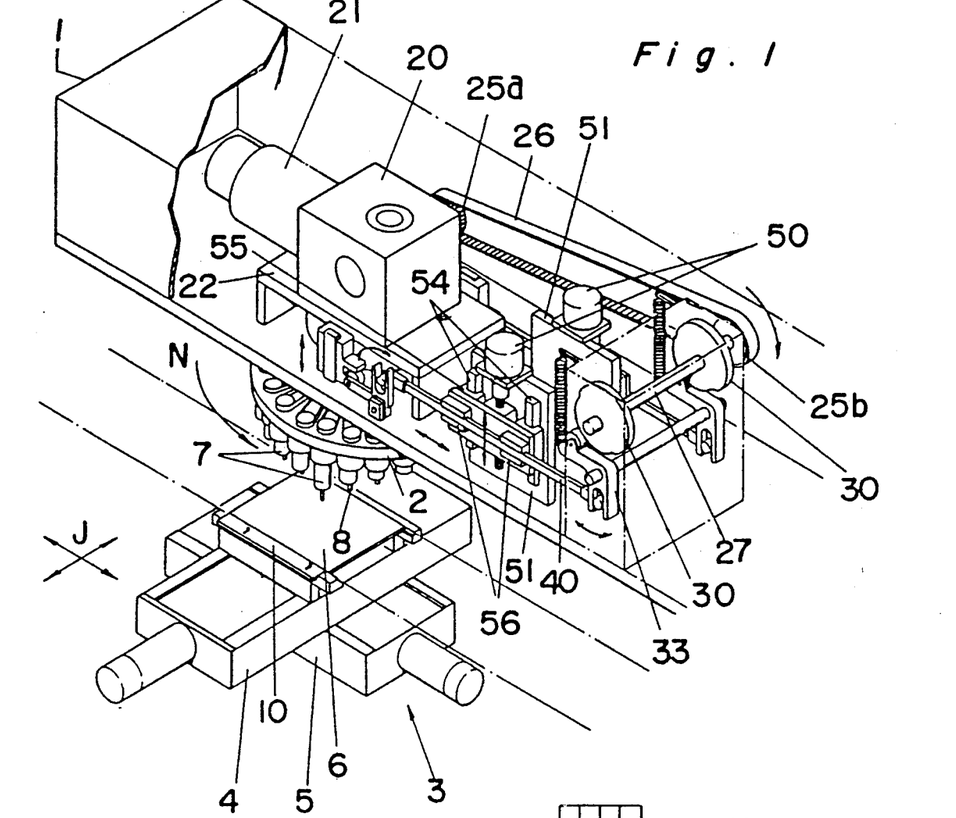
FIG. 1 is a perspective view of a component mounting apparatus embodying the present invention.

Referring first to FIG. 1, a component mounting apparatus according to one preferred embodiment of the present invention comprises a machine bodywork 1 of generally rectangular box-like configuration, a head carrier carrie turntable 2 supported below the machine bodywork 1 for intermittent rotation in one direction shown by the arrow N, and a mounting bench 3 including an X-axis table 4 and a Y-axis table 5, the X-axis table 4 being mounted on the Y-axis table 5 for sliding motion in one direction relative to the Y-axis table 5 while the Y-axis table 5 is slidable relative to the X-axis table 4 in a direction perpendicular to the direction of movement of the X-axis table.

The mounting bench 3 is adapted to support thereon a printed circuit board 6 firmly secured thereon by means of a clamp unit 10. Since the mounting bench 3 is comprised of the X- and Y-axis tables 4 and 5 movable in respective directions perpendicular to each other, the printed circuit board 6 can be moved in any desired direction, shown by J, by a combined movement of those tables 4 and 5 for positioning the printed circuit board 6 on the bench 3 relative to any one of mounting heads 7.

Figure 2:
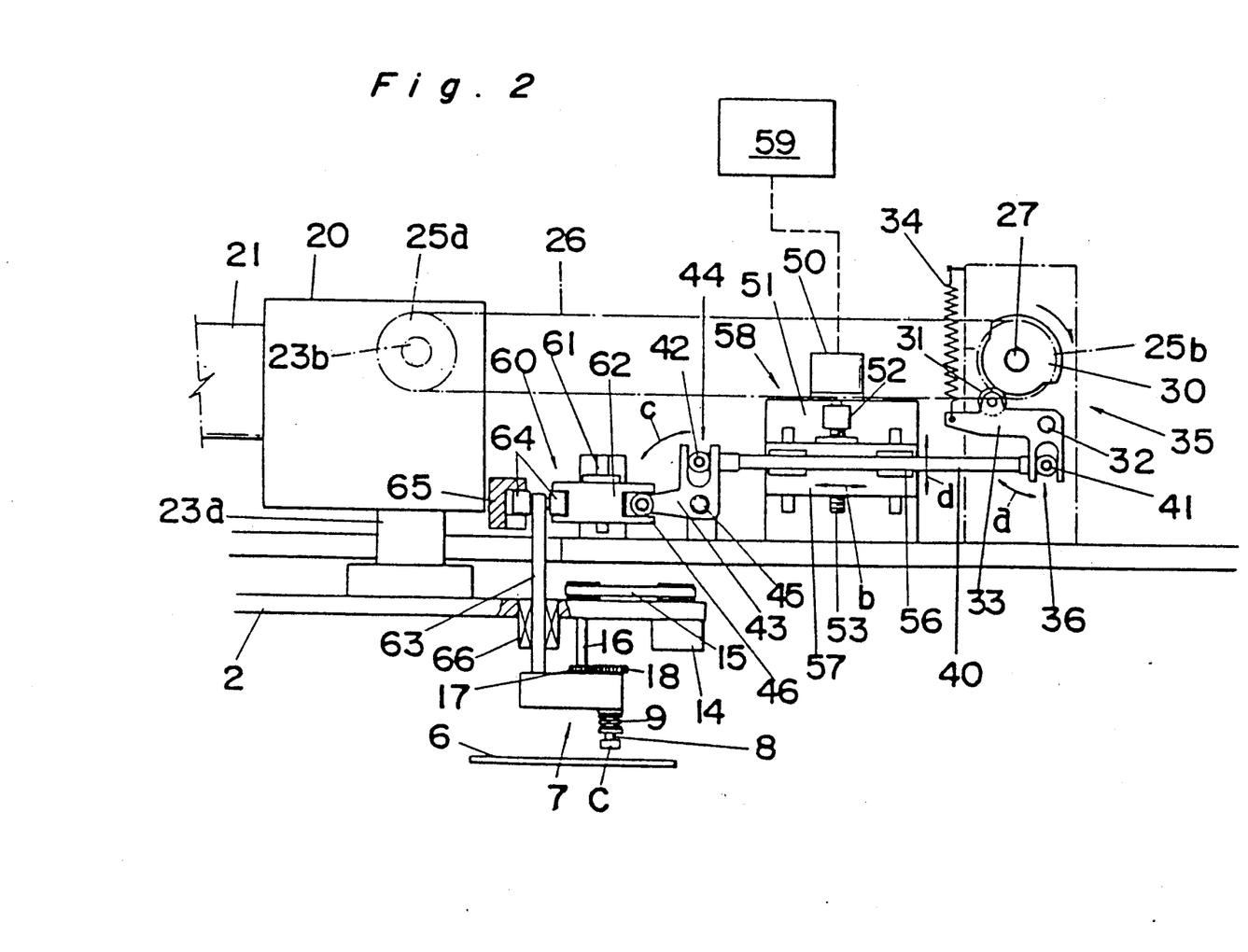
FIG. 2 is a front elevational view of the apparatus shown in FIG. 1.
Figure 3:
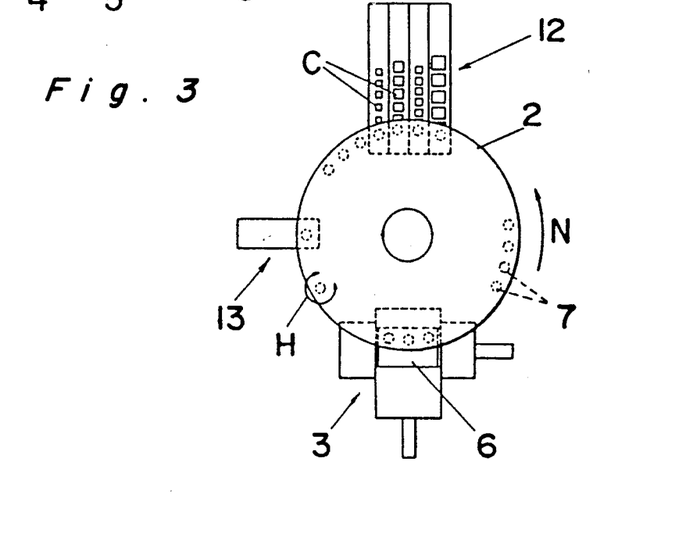
FIG. 3 is a top plan view of a carrier turntable used in the apparatus.

As best shown in FIGS. 1 and 2, the head carrier carrier turntable 2 is in the form of a disc and has its undersurface carrying a circular row of the plural mounting heads 7, which row is coaxial with the axis of rotation of the head carrier carrier turntable 2. Each of the mounting heads 7 has a respective suction nozzle 8 protruding downwards therefrom and away from the undersurface of the carrier turntable 2 in a direction opposite to the machine bodywork 1, which nozzle 8 is operable to hold an electronic component by the effect of a substantial vacuum developed inside the suction nozzle 8. Reference numeral 9 used in FIG. 2 represents a coil spring for imparting a cushioning effect to the suction nozzle 8 for each mounting head 7.

Referring now to FIGS. 1 to 5, at the delivery station, there is arranged a delivery unit 12 accommodating electronic components C to be mounted on a printed circuit board 6. The delivery unit 12 is disposed at a location opposite the mounting station at which the mounting bench 3 is disposed. The electronic components C on the delivery unit 12 can be successively transported for mounting on the printed circuit board 6 from the delivery station to the mounting station by a combined action of the carrier turntable 2, which is intermittently rotatable, and any one of the mounting heads 7 selectively shiftable between elevated and lowered positions as will be described later in detail. On the path of transport of the electronic components C and between the delivery station and the mounting station, an identifier 13 is disposed for detecting, and generating an error signal indicative of, a displacement or twist of each electronic component C picked up by the respective suction nozzle 8 relative to the longitudinal axis of such suction nozzle 8. The error signal generated from the identifier 13 can be utilized to drive a drive motor 14 carried by the carrier turntable 2 as shown in FIG. 2 for the eventual purpose of correcting the displacement or twist of the electronic component C then picked up by the suction nozzle 8. More specifically, the drive of the drive motor 14 can be transmitted to the associated mounting head 7 through an endless belt 15, a splined shaft 16 and gears 17 and 18 to turn such associated mounting head 7 in a direction, shown by the arrow H in FIG. 3, about the longitudinal axis of such mounting head 7, thereby correcting the displacement or twist of the electronic component C relative to the longitudinal axis of the suction nozzle 8.

Hereinafter, a drive mechanism for driving each of the mounting heads 7 will be described with particular reference to FIGS. 1 and 2.

Within the machine bodywork 1, a drive box 20 is rigidly mounted on a support frame 22 which is in turn positioned immediately above the carrier turntable 2. The drive box 20 is coupled with a drive unit 21 for the drive box 20 and has an output shaft 23a extending downwardly and outwardly from the drive box 20 and coupled coaxially rigidly with the carrier turntable 2 so that the latter can rotate together with the output shaft 23a. The drive unit 21 is so designed as to intermittently drive the carrier turntable 2 in the direction N in a horizontal plane and includes a stepper motor whose drive can be transmitted to each of the mounting heads 7 through a predetermined drive transmission path, as will be described later, to shift the respective mounting head 7 over a predetermined stroke between the elevated and lowered positions in a direction perpendicular to the plane of rotation of the carrier turntable 2. The drive box 20 also has a second output shaft 23b protruding outwardly therefrom and having a drive pulley 25a rigidly mounted thereon for rotation together therewith. The predetermined drive transmission path extending from the drive box 20 to each of the mounting heads 7 includes, in addition to the drive pulley 25a, a driven pulley 25b rigidly mounted on a cam drive shaft 27 and an endless drive belt 26 trained between the drive and driven pulleys 25a and 25b. The cam drive shaft 27 has two cam discs, generally identified by 30, which are rigidly mounted thereon for rotation together with and are spaced a distance apart from each other.

According to the present invention, a lifting mechanism for shifting each of the mounting heads 7 between the elevated and lowered positions is disposed at each of the delivery and mounting stations. Since the lifting mechanisms at the delivery and mounting stations are of identical construction, reference will be now made only to the lifting mechanism at the mounting station in describing the details thereof for the sake of brevity.

With particular reference to FIG. 2, the lifting mechanism disposed at the mounting station includes a cam follower 31 rotatably mounted on a generally L-shaped lever 33 that is pivotally supported by the machine bodywork 1 by means of a pivot pin 32, and a biasing spring 34 for urging the L-shaped lever 33 in a direction, shown by the arrow a, required to cause the cam follower 31 to slidingly engage a peripheral cam face of the cam disc 30 at all times. Thus, it will readily be seen that, as the cam disc 30 undergoes one complete rotation together with the cam drive shaft 27, the L-shaped lever 33 is angularly reciprocated about the pivot pin 32 with the cam follower 31 following the contour of the peripheral cam face of the cam disc 30. It is to be noted that the machine elements 30, 31, 32, 33 and 34 referred to above altogether constitute a first motion translator 35 operable to translate a rotary motion of the cam disc 30 into a rocking motion assumed by the L-shaped lever 33.

The lifting mechanism also includes a tie rod 40 extending generally parallel to the plane of rotation of the carrier turntable 2 and having rollers 41 and 42 mounted rotatably on opposite ends thereof. The roller 41 adjacent the L-shaped lever 33 is loosely engaged in a groove 36 defined in one of the opposite ends of the lever 33 whereas the roller 42 adjacent the lever 43 is loosely engaged in a groove 44 defined in one of opposite ends of a similarly L-shaped lever 43. It will readily be seen that, when the lever 33 is pivoted about the pivot pin 32 in the manner as hereinabove described, the tie rod 40 can reciprocate linearly in a direction shown by the arrow b to cause the lever 43 to pivot about a pivot pin 45 used to secure the lever 43 to the machine bodywork 1.

A stepper motor 50 is supported by the machine bodywork 1 through a support bracket 51 at a location above the tie rod 40. This stepper motor 50 has a drive shaft coupled with a screw feeder 53 through a coupling 52, said screw feeder 53 extending downwardly in a direction perpendicular to the tie rod 40 and threadingly engaged through a guide block 57 that is movable along the screw feeder 53 while guided by vertical guide members 54 and 55 shown in FIG. 1. This guide block 57 is operatively coupled with the tie rod 40 by means of at least two horizontal guide members 56 secured to one side face of the guide block 57 and slidably receiving therein the tie rod 40 so that, while the tie rod 40 can move horizontally guided by the horizontal guide members 56, it can also be shifted up and down together with the guide block 57 when the screw feeder 53 is driven by the stepper motor 50.

A second motion translator which is operable to translate the horizontal linear motion of the tie rod 40 into a vertical linear motion assumed by each mounting head 7 as will become clear from the subsequent description is generally identified by 60 and comprises a guide block 61 rigidly mounted on a bottom wall of the machine bodywork 1, and a generally rectangular slider 62 carried by and movable along the guide block 61 in a direction perpendicular to the longitudinal axis of the tie rod 40 and also perpendicular to the plane of rotation of the carrier turntable 2. The slider 62 has its opposite ends formed with inwardly recessed grooves into which a roller 46, rotatably mounted on the other end of the lever 43, and one of two rollers 64 mounted on a lifting shaft 63 are operatively received, respectively, the other of the two rollers 64 on the lifting shaft 63 being engaged in a groove defined in a guide ring 65. The lifting shaft 63 is movable up and down in a direction perpendicular to the plane of rotation of the carrier turntable 2 while guided by a guide boss 66 carried by the carrier turntable 2 for each mounting head 7.

The drive transmission path from the drive unit 21 to each mounting head 7 is schematically illustrated in FIG. 1, reference to which will now be made for the discussion on how each lifting shaft 63, hence, each mounting head 7, can be shifted between the elevated and lowered position.

During each complete rotation of the cam disc 30 together with the cam drive shaft 27, the lever 33 is reciprocatingly pivoted in the direction shown by the arrow accompanied by the horizontal reciprocating motion of the tie rod 40 in the direction shown by the arrow b. Consequent upon the horizontal reciprocating motion of the tie rod 40, the lever 43 is similarly pivoted in the direction shown by the arrow c to cause the slider 62 to be guided up and down along the guide block 61, thereby permitting the respective mounting head 7, operatively coupled with the lifting shaft 63 through the slider 62, to be moved between the elevated and lowered positions.

Figures 4, 6, 7:
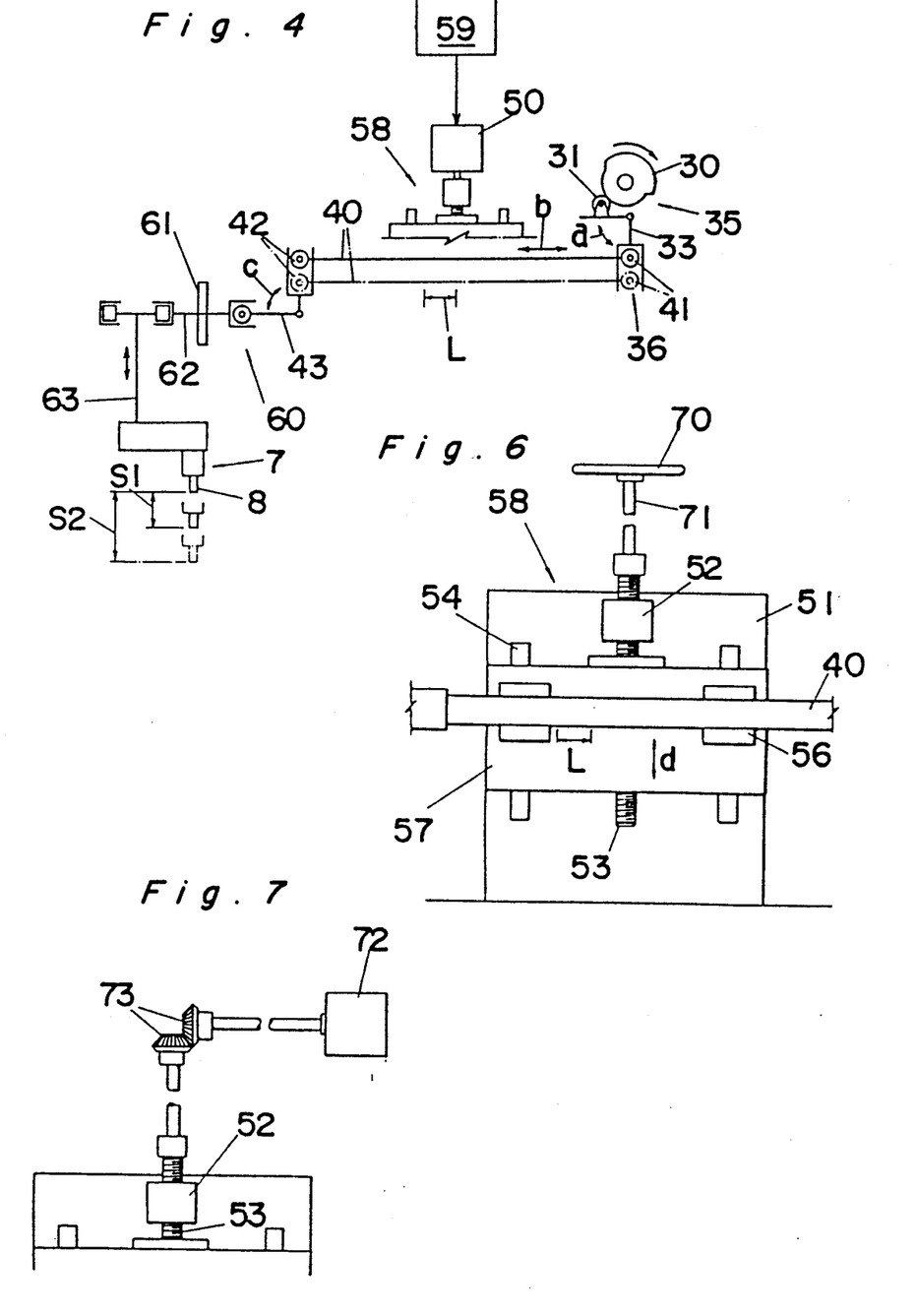
FIG. 4 is a schematic front elevational view of a drive mechanism used in the apparatus.
FIGS. 6 and 7 are schematic front elevational views of the drive mechanism according to a different embodiment of the present invention.

Referring still to FIG. 4, if the tie rod 40 is moved upwards together with the guide block 57 to assume a high position with the roller 41 consequently engaged deep into the groove 36 in the lever 33 as shown by the solid line, the tie rod 40 can be horizontally moved a relatively small distance by the lever 33, that is, the stroke L of horizontal linear movement of the tie rod 40 is small, and therefore, the angle over which the lever 43 is pivoted about the pivot pin 45 is correspondingly small, resulting in a relatively short stroke of movement of the mounting head 7 between the elevated and lowered position as indicated by S1. Conversely, if the tie rod is moved downwards together with the guide block 57 to assume a lower position with the roller 41 consequently engaged not deep in the groove 36 in the lever 33 as shown by the phantom line in FIG. 4, the stroke L of horizontal linear movement of the tie rod 40 is relatively long and, therefore, the angle over which the lever 43 is pivoted about the pivot pin 45 is relatively great, resulting in a relatively large stroke of movement of the mounting head 7 between the elevated and lowered position as indicated by S2.

Thus, the component mounting apparatus embodying the present invention makes use of a computer 59 for controlling the stepper motor 50 for driving the screw feeder 53 to move the guide block 57 up and down thereby to move the tie rod 40 between the high and low positions referred to above so that the stroke of movement of each mounting head 7 between the elevated and lowered positions determined by the design of the peripheral cam face of the cam disc 30 can be adjustable.

As hereinbefore described, the tie rod 40 and a means for adjusting the position of the tie rod in a direction perpendicular to the longitudinal sense of the tie rod altogether constitute an adjusting mechanism 58 operable to adjust the amount of drive transmitted from the first motion translator 35 to the second motion translator 60. Accordingly, if the computer 59 is so programmed, or loaded with a software so programmed, as to control the amount of rotation of the stepper motor 50 appropriate to one of the different thicknesses D1, D2, D3, . . . and Dn of electronic components C1, C2, C3, . . . and Cn shown in FIG. 5, the stroke of movement of each mounting head 7 required to mount one of the electronic components C1 to Cn onto the printed circuit board 6 properly can be automatically controlled.

While the details of one of the lifting mechanisms which is associated with the mounting station has been described, it is to be noted that the lifting mechanism associated with the delivery station is identical in structure with, and is operated in a manner similar to, that at the mounting station and, therefore, the stroke of movement of each mounting head 7 between the elevated and lowered position for picking up the electronic component at the delivery station is also automatically adjusted depending on the thickness of the electronic component to be picked up for delivery to the mounting station.

The operation of the component mounting apparatus of the above described construction will now be described with particular reference to FIG. 5.

Figure 5:
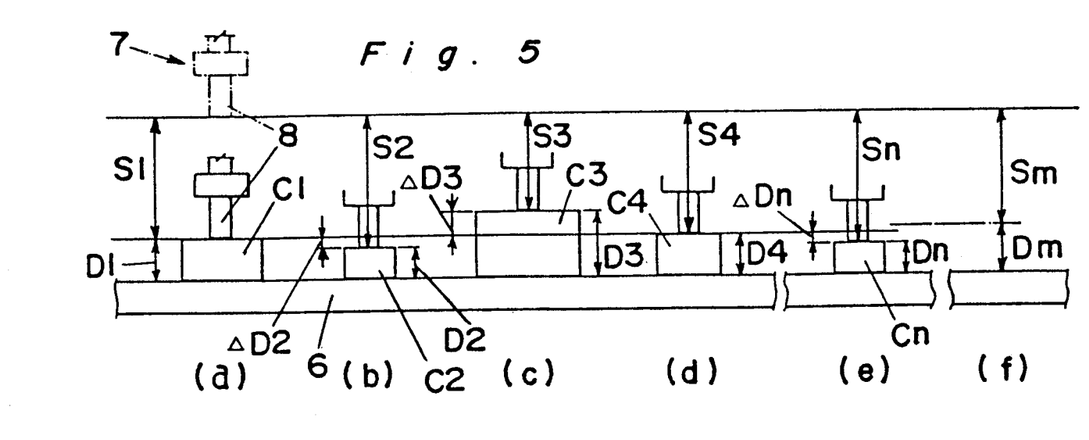
FIG. 5 is a schematic front elevational view of a portion of the drive mechanism.

During the execution of a work schedule, the first electronic component C1 shown at (a) in FIG. 5 is mounted on the printed circuit board 6 by the movement of the associated mounting head 7. In such case, the stepper motor 50 is controlled so as to move the tie rod to a predetermined height above the bottom wall of the machine bodywork 1 which is required to eventually permit the electronic component C1 of thickness D1 to be properly mounted on the printed circuit board 6, the control value utilized being stored in the computer 59. By this teaching means, the stroke of movement of the mounting head 7 required to properly mount the electronic component C1 of the thickness D1 is determined as a reference stroke S1. Subsequently, and when the electronic components C2 to Cn having different thicknesses D2 to Dn other than the electronic component C1 are to be successively mounted on the printed circuit board 6, the strokes of movement of the mounting heads 7 required to properly mount the electronic components C2 to Cn on the printed circuit board 6, respectively, can be determined by adding to the reference stroke Sl the difference between the thickness D1 of the electronic component C1 and each of the thicknesses D2 to Dn of the respective electronic components C2 to Cn as a correction value.

In other words, as shown at (b), (c), (d) and (e) in FIG. 5, since the thickness D2 to Dn of each of the electronic components C2 to Cn to be mounted subsequent to the first electronic component C1 is known, the difference $\Delta D2$, $\Delta D3$, . . . and $\Delta Dn$ between the thickness D1 and each of the thicknesses D2 to Dn is also known. Hence, if the number of rotation of the stepper motor 50 is so programmed as to be a function of the difference $\Delta D2$, $\Delta D3$, . . . and $\Delta Dn$ in thickness so that the computer 59 can supply a pulse signal of a duration variable depending on the difference to the stepper motor 50 to drive the latter, the mounting head 7 can be moved between the elevated and lowered position with its stroke S2, S3, . . . and Sn properly chosen for the exact and correct mounting of the associated electronic component onto the printed circuit board 6. One of the most important advantages brought about by this means is that, during the continued rotation of the cam disc 20 and with no need to bring the apparatus to a halt, the automatic control of the stepper motor 50 by the computer 59 permits the stroke of movement of each mounting head 7 to be adjusted according to the thickness of the electronic component to be mounted on the printed circuit board. This features is very important to any kind of electronic component mounting apparatus which requires a speed-up and accurate performance of the mounting job.

Therefore, unless all of the electronic components to be handled by the mounting apparatus of the present invention are uniform in thickness, that is, where the electronic components to be handled by the mounting apparatus of the present invention have a varying thickness, the guide block 57 associated with the mounting station and the guide block 57 associated with the delivery station have to be controlled so as to move a different stroke although the method for controlling them may be identical.

In describing the foregoing preferred embodiment of the present invention with reference to FIGS. 1 to 5, reference has been made to the use of the stepper motor 50 in combination with the computer 59 for controlling the stepper motor 50 to drive the guide block 57 thereby to adjust the position of the tie rod 40 between the high and low positions. However, in the practice of the present invention, the use of the stepper motor 50 alone or in combination with the computer 59 is not always essential and either a manual adjusting mechanism or an adjusting mechanism comprising any suitable standard electric motor may be employed such as shown in FIG. 6 and FIG. 7, respectively.

In the embodiment shown in FIG. 6, the manual adjusting mechanism comprises a turn handle 70 having a shaft 71 coupled to the screw feeder 53 through the coupling 52. According to this embodiment, the position of the tie rod 4 has to be adjusted by turning the handle 70 so that each mounting head 7 can be moved between the elevated and lowered position over the average stroke Sm which corresponds to the average thickness Dm (shown at (f) in FIG. 5) of all of the electronic components C1 to Cn to be handled by the mounting apparatus of the present invention.

While the mounting apparatus according to the embodiment of FIGS. 1 to 5 wherein the position of the tie rod 40 can be controlled by the computer 59 to accommodate the varying thickness of the electronic components is effective to handle the electronic components of the varying thickness at all times, the mounting apparatus according to the embodiment of FIG. 6 requires the handle 70 to be turned to reposition the tie rod 40 when the average thickness Dm of the electronic components departs from a predetermined value.

In the embodiment shown in FIG. 7, the adjusting mechanism comprises any well known standard electric motor 72 having its drive shaft coupled to the screw feeder 53 through the coupling by way of a bevel gear arrangement 73. Alternatively, the drive shaft of the motor 72 may be coupled direct to the screw feeder 53. The motor 72 may be connected with a source of electric power through a power on-off switch (not shown) adapted to be manipulated when the average thickness Dm of the electronic components departs from a predetermined value to eventually reposition the tie rod 40 in a manner substantially similar to the method described in connection with the embodiment of FIG. 6.

Although in describing the structure and the operation of the component mounting apparatus reference has been made to that associated with the mounting of the electronic components on the printed circuit board at the mounting station, the successive pick-up of the electronic components at the delivery station in a manner similar to that described in connection with the successive mounting of the electronic components at the mounting station. Specifically, the movement of each mounting head between the elevated and lowered position at the delivery station may either be synchronized with that at the mounting station if the delivery and mounting stations are spaced 180° from each other about the axis of rotation of the carrier turntable, or be timed in any suitable manner depending on the angular spacing between the delivery and mounting stations. However, it may be necessary to differentiate the stroke of movement of each mounting head ready to mount the respective electronic component onto the printed circuit board at the mounting station from that ready to pick up the electronic component at the delivery station because one electronic component to be picked up at the delivery station does not always have the same thickness as that of the electronic component to be mounted at the mounting station.

As hereinbefore fully described, in the path of transmission of drive from the drive unit to each of the mounting heads employed in the mounting apparatus of the present invention, the provision has been made of means for adjusting the amount of drive to be transmitted to each of the mounting heads so that the stroke of movement of the respective mounting head at any one of the delivery and mounting stations can be adjusted to accommodate the electronic components of varying thickness. Therefore, the adjustment or modification of the stroke of movement of the respective mounting head can readily and with no difficulty be accomplished by adjusting the amount of drive to be transmitted to the respective mounting head. In addition, the drive of the adjusting means can be accomplished by the computer-controlled motor to accommodate the electronic components of varying thickness. Alternatively, the drive of the adjusting means can be accomplished manually to cause each mounting head to be moved between the elevated and lowered positions over the average stroke corresponding to the average thickness of all of the electronic components handled by the mounting apparatus. In this latter case, the manual adjustment of the adjusting means can be accomplished by turning the handle through a predetermined angle or by controlling the on-off of the electric motor.

Moreover, according to the present invention, the single drive unit is sufficient to drive some of the mounting heads successively brought to the mounting station and some of the mounting heads successively brought to the delivery station and, therefore, the drive mechanism required in the mounting apparatus can be simplified.

Furthermore, according to the method accomplished by the above described construction, the detection of the stroke of movement of one of the mounting heads which has picked up and subsequently mounted the first one of the electronic components can provide a correction value required to permit the next succeeding mounting heads to undergo the respective stroke of movement appropriate to pick up and mount each of the succeeding electronic components which may differ in thickness from the first electronic component and also from each other.

Although the present invention has been fully described in connection with the preferred embodiments thereof with reference to the accompanying drawings, it is to be noted that various changes and modifications are apparent to those skilled in the art. For example, although a board or substrate onto which the electronic components are mounted with the mounting apparatus of the present invention has been described and shown as the printed circuit board, the present invention may not be limited to the mounting of the electronic components on such printed circuit board and any other suitable board or substrate may be employed.

Such changes and modifications are to be understood as included within the scope of the present invention as defined by the appended claims unless they depart therefrom.

I claim:

1. An electronic mounting apparatus for mounting electronic components on a surface, comprising: a component mounting head capable of moving between a lowered position spaced a predetermined distance above the surface and an elevated position spaced upwardly from the lowered position; drive means for driving the component mounting head between the lowered position and the elevated position; and a drive transmission disposed between the component mounting head and the drive means and including an adjusting means for adjusting the lowered position of the component mounting head means.

2. The apparatus as claimed in claim 1, wherein the component mounting head is a carrier turntable.

3. The apparatus as claimed in claim 1, wherein the drive transmission is a linkage.

4. The apparatus as claimed in claim 1, wherein the drive transmission is a linkage and the adjusting means is a means for changing the point at which the drive source acts and the position of a dynamic point of the component mounting head.

5. An electronic component mounting apparatus for mounting electronic components on a surface, comprising: a component mounting head capable of moving between a lowered position spaced a predetermined distance above the surface and an elevated position spaced upwardly from the lowered position; drive means for driving the component mounting head means between the lowered position and the elevated position; a drive transmission disposed between the component mounting head and the drive means and including an adjusting means for adjusting the lowered position of the component mounting head; and a control means for controlling the adjusting means.

6. The apparatus as claimed in claim 5, wherein the drive transmission is a linkage.

7. The apparatus as claimed in claim 5, wherein the drive transmission is a linkage and the adjusting means is a means for changing the point at which the drive source acts and the position of a dynamic point of the component mounting head.

8. An electronic component mounting apparatus for mounting electronic components on a surface, comprising: a component mounting head capable of moving between a lowered position spaced a predetermined distance above the surface and an elevated position spaced upwardly from said lowered position; drive means for driving the component mounting head between the lowered position and the elevated position; a drive transmission disposed between the component mounting head and the drive means and including an adjusting means for adjusting the lowered position of the component mounting head; and a control means for controlling the adjusting means, said control means being designed to control the lowered position of the component mounting head means in reference to the difference between the thickness of a first one of electronic components which has been mounted and the next succeeding one or ones of the electronic components to be subsequently mounted.

9. An electronic component mounting apparatus for mounting electronic components on a surface, comprising:
   a carrier turntable supported for rotation in a predetermined plane from a delivery station back to the delivery station via a mounting station during each complete rotation thereof;
   a plurality of equally spaced mounting heads mounted on said carrier turntable in a circular row coaxial with the axis of rotation of the turntable, each of said mounting heads being supported for movement in a direction perpendicular to said predetermined plane between a lowered position spaced a predetermined distance above the surface and an elevated position spaced upwardly from said lowered position;
   a drive mechanism used for each of the delivery station and the mounting station and including a rotary cam means having a predetermined cam profile, a first motion translator means for translating a rotary motion of the rotary cam means into a linear motion in a first direction generally parallel to said predetermined plane, a second motion translator means operatively associated with each of the mounting heads, and a linkage means, operatively coupled at one end with the first motion translator means and at the opposite end with the second motion translator means, for transferring the linear motion from said first motion translator means to said second motion translator means, said second motion translator means being operable to translate the linear motion of the linkage means into a linear motion in a second direction substantially perpendicular to the first direction, each of the mounting heads being driven by said linear motion in the second direction between the elevated and lowered positions; and
   means for adjusting the amount of said linear motion in the first direction to thereby adjust the stroke of movement of each mounting head between the elevated and lowered positions.

10. The apparatus as claimed in claim 9, wherein said adjusting means comprises a guide block coupled with the linkage means, and a drive means for driving the guide block in a direction perpendicular to the first direction to selectively lift and lower the linkage means between high and low positions.

11. The apparatus as claimed in claim 10, wherein said drive means comprises a screw feeder drivingly coupled to the guide block, and a computer-controlled drive motor having a drive shaft coupled with the screw feeder.

12. The apparatus as claimed in claim 10, wherein said drive means comprises a screw feeder drivingly coupled to the guide block, and a manually operated handle drivingly coupled with the screw feeder.

13. The apparatus as claimed in claim 10, wherein said drive means comprises a screw feeder drivingly coupled to the guide block, and an electric drive motor having a drive shaft coupled with the screw feeder.

* * * * *